United States Patent [19]

Manley

[11] Patent Number: 5,404,037
[45] Date of Patent: Apr. 4, 1995

[54] EEPROM CELL WITH THE DRAIN DIFFUSION REGION SELF-ALIGNED TO THE TUNNEL OXIDE REGION

[75] Inventor: Martin H. Manley, Saratoga, Calif.

[73] Assignee: National Semiconductor Corporation, Santa Clara, Calif.

[21] Appl. No.: 214,786

[22] Filed: Mar. 17, 1994

[51] Int. Cl.⁶ ............................................. H01L 29/78
[52] U.S. Cl. ...................................... 257/321; 257/318
[58] Field of Search ............. 257/321, 316; 437/43; 365/185

[56] References Cited

U.S. PATENT DOCUMENTS

5,273,923  12/1993  Chang et al. ........................ 257/321

FOREIGN PATENT DOCUMENTS

1-37877  2/1989  Japan ................................. 365/185

OTHER PUBLICATIONS

C. Kuo et al., *An 80 ns 32K EEPROM Using the FETMOS Cell*, Journal of Solid-State Circuits vol. SC-17, No. 5, Oct. 1982, pp. 821-827.

T. Y. Chan et al., *The Impact of Gate-Induced Drain Leakage Current on MOSFET Scaling*, Electronics Research Laboratory, Department of Electrical Engineering and Computer Sciences, University of California, Berkeley, Calif. 94720 1987, pp. 718-721, (IEDM).

W. S. Johnson et al., *THPM 12.6: A 16Kb Electrically Erasable Nonvolative Memory*, ISSCC 80/Thursday, Feb. 14, 1980, 1980 IEEE International Solid-State Circuits Conference, pp. 152-153, Digest of Technical Papers.

*Primary Examiner*—Robert P. Limanek
*Attorney, Agent, or Firm*—Limbach & Limbach; H. Donald Nelson, Stephen R. Robinson

[57] ABSTRACT

A method of semiconductor fabrication, in which a single aperture is used to define both a thin oxide tunneling region and a drain diffusion region in a self-aligned fashion, produces a device structure suitable for use in an electrically-erasableread-only memory (EEPROM) cell. A gate oxide is grown, then a photoresist mask is formed having a slit for ion implantation into the drain diffusion region. The oxide within the slit is etched away, and ion implantation forms a drain diffusion region. After the mask is stripped away, a healing furnace cycle removes the implant damage. A thin tunnel oxide layer is grown over the drain diffusion region, and then a polysilicon floating gate is formed so that one edge of this gate intersects a portion of the area of tunnel oxidation so as to form a small region of tunnel oxide under the floating gate. The process sequence then reverts to a conventional MOS flow. The self-aligned drain diffusion region and tunnel oxide region can be used in a variety of EEPROM cell designs. One embodiment involves a double-polysilicon, single-metal process in which three diffusion regions are used to form the EEPROM cell. The second layer of polysilicon overlies the floating gate and forms a control gate word line. The control gate and the floating gate overly the channel between the drain diffusion region and a common source diffusion region. The first layer of polysilicon is also used to form a select gate overlying the channel between the drain diffusion region and a select drain diffusion region. The metal layer provides contact to the select drain diffusion region and forms the bit line.

8 Claims, 8 Drawing Sheets

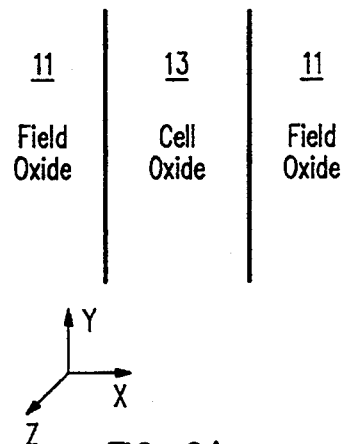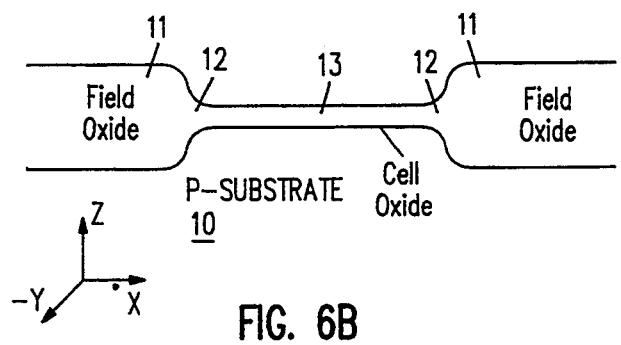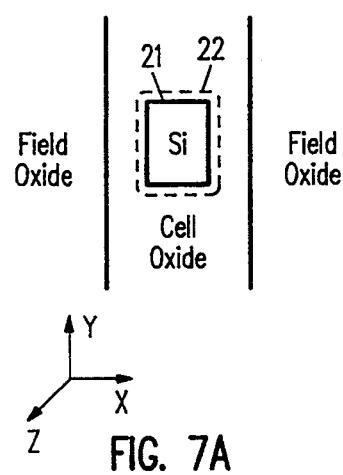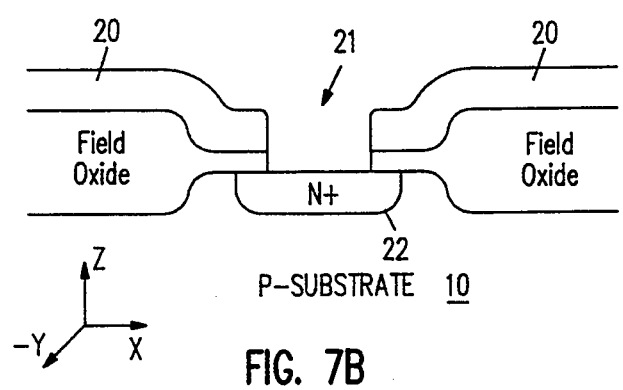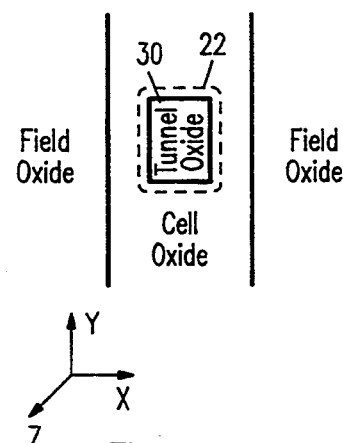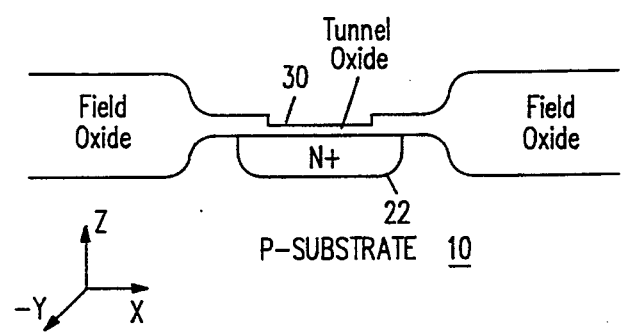

EEPROM CELL WITH THE DRAIN DIFFUSION REGION SELF-ALIGNED TO THE TUNNEL OXIDE REGION

BACKGROUND OF THE INVENTION

1. Field of the Invention

The present invention relates to electrically erasable programmable read only memory (EEPROM) devices and, in particular, to an EEPROM cell structure that employs a tunnel window region fabricated using self-alignment techniques.

2. Discussion of the Prior Art

Floating-gate electron tunneling MOS (FETMOS) structures have been successfully used to accomplish reliable charge transfers to the floating gate in EEPROM cell structures. See C. Kuo, et al., IEEE Journal of Solid-State Circuits, Vol. SC-17, No. 5, October 1982, pp. 821–827. The FETMOS device relies on Fowler-Nordheim tunneling of electrons between the floating gate and the substrate to accumulate charge on the floating gate for program or erase operations. FETMOS devices use an isolated polysilicon node as the floating gate and silicon dioxide ($SiO_2$) to insulate the floating gate.

A conventional FETMOS cell is depicted in FIGS. 1–3. The oxide region underlying the floating gate consists of a uniform sheet of thin tunnel oxide, typically less than about 200 Å thick. The control gate is separated from the floating gate by a thicker insulator, typically oxide/nitride/oxide (ONO).

To erase a programmed EEPROM cell, a high voltage is applied to the control gate, while both the drain and the source of the FETMOS are grounded. The amount of voltage coupled to the floating gate through capacitive coupling is sufficient to create an electric field in the thin tunnel oxide for tunneling of electrons from the substrate to the floating gate. The resulting accumulation of negative charge on the floating gate shifts the FETMOS threshold voltage to a more positive value.

Conversely, to program the cell, a high voltage is applied to the drain, while the control gate is grounded and the source is either biased at +5V or allowed to float. The electric field created in the thin tunnel oxide between the floating gate and the overlapped portion of the drain causes electrons to tunnel from the floating gate to the drain. This results in an accumulation of positive charge on the floating gate and a negative shift of the FETMOS threshold voltage.

In order to remove electrons from the floating gate, an edge of the N+ drain diffusion of the selected cell underlaps at least one edge of the cell's floating gate. This underlap creates problems. See T. Y. Chan, et al., IEDM 1987, CH2515-5/87/0000-0718, pp. 718–721. For example, the gate-to-drain overlap region creates a deep depletion region under the tunnel oxide that overlaps the drain. In the presence of the very high electric field which exists during programming operations, band-to-band tunneling increases the drain leakage current. Electron-hole pairs are generated by the tunneling of valence band electrons into the conduction band and collected by the drain and substrate. The holes that escape into the substrate via this mechanism represent an undesired leakage current. This leakage current increases over time each time the cell is subsequently programmed, because the leakage current leads to increased trap generation in the tunnel oxide. The creation of an electron trap in the tunnel oxide between the floating gate and the drain impedes the mechanism for charge transferral during erasing and programming operations. Therefore, the endurance characteristic of the cell is lessened. In other words, fewer re-program cycles may be executed before the cell fails to program correctly.

Another problem with the conventional FETMOS EEPROM cell is that the tunnel oxide extends all the way to the field oxide interface. Typically, the field oxide will at least partially cover the drain and/or source regions, tapering away into a "bird's beak" along its boundaries. It is well known that stress along the edge of the field oxide bird's beak region will degrade the quality of a thin oxide grown in this region. Any defect or discontinuity of the thin oxide region can lead to unintended connections which give rise to defective bits in the memory array. Thus, an increase in the incidence of defective bits and a decrease in the yield results from the extension of the tunnel oxide over the drain and to the interface with the field oxide.

The well-known FLOTOX (floating gate tunnel oxide) EEPROM cell overcomes the problems associated with the above-described FETMOS cell. See W. S. Johnson, et al., 1980 IEEE International Solid-State Circuits Conference, pp. 152–153. FIGS. 4 and 5 show a conventional FLOTOX cell. Most of the floating gate of the FLOTOX cell overlies a thicker gate oxide (typically 300 to 400 Å). The FETMOS cell's problems with leakage current are avoided in the FLOTOX cell because the edges of the drain diffusion terminate under thicker gate oxide; thus, the field across the oxide during programming is lower, and there is less chance of generating leakage current due to band-to-band tunnelling. Since the termination of the drain diffusion region is far away from the tunnel oxide, the source of any leakage current is remote from the delicate tunnel oxide region, and degradation due to the generation of electron traps is minimized. Furthermore, because the tunnel window in the FLOTOX cell is small, and is surrounded on all sides within the same plane by thicker gate oxide, the tunnel oxide is kept away from the field oxide edge and the stress which accompanies the edge.

Although the FLOTOX cell remedies two key problems associated with the FETMOS cell, it presents additional problems. First, the FLOTOX cell introduces additional masking steps to the process sequence, thus increasing the cost of fabrication and increasing the sources for potential defects. Second, the formation of the tunnel oxide region and the buried N+ diffusion regions are not self-aligned steps. Thus, the height of the memory cell is increased. For instance, as shown in FIG. 4, in a typical FLOTOX cell layout, the overlap of the upper edge of the floating gate over the buried N+ drain region is 3λ, where λ is the minimum design rule feature of the fabrication process.

SUMMARY OF THE INVENTION

The present invention provides an integrated circuit device structure in which a single aperture is used to define both the tunnel oxide region and the drain diffusion region of an EEPROM cell.

In accordance with a preferred embodiment of the invention, a diffusion structure is fabricated in a semiconductor substrate by the following sequence of steps: Following a conventional well formation and field oxide growth, a sacrificial gate oxide is grown and stripped and a layer of cell gate oxide about 400 Angstroms thick is formed. Next, a photoresist mask having a slit which defines the drain implantation area is formed and the gate oxide layer is stripped away in this area exposing bare substrate. Dopant ions are then implanted into this drain implantation area through the slit in the photoresist mask, forming the drain diffusion region. The photoresist mask is stripped and the implantation damage is annealed using a dilute oxygen healing furnace cycle at about 920 degrees Celsius, which grows about 150 Angstroms of oxide. A wet oxide strip removes the newly grown oxide. This is followed by a conventional tunnel oxide pre-clean cycle. A tunnel oxide layer is then grown to a thickness of about 83 Angstroms overlying the drain diffusion region. A first layer of polysilicon (poly1) is then deposited and doped. Next, a mask is formed which is used to etch the poly1, and potentially exposed oxides, such that the poly1 overlies a portion of the layer of tunnel dielectric material in the drain implantation area and such that it overlies an adjacent portion of the gate dielectric material. This etched poly1 forms the floating gate of the structure.

Of course, those skilled in the art will appreciate that dopant atoms could be introduced into the drain implantation area prior to removal of the gate oxide by utilizing a higher implant energy.

The resulting EEPROM cell manufactured in accordance with the present invention is superior to the FLOTOX cell in that its vertical pitch is reduced, typically by twice the minimum design rule distance ($\lambda$). This is because, as discussed above, the typical FLOTOX cell has a 3$\lambda$ overlap of the floating gate and the drain diffusion region, whereas in a cell manufactured in accordance with the present invention, this overlap is typically only 1$\lambda$. Secondly, an EEPROM cell manufactured in accordance with the present invention requires one less masking step because the tunnel region is self-aligned to the drain diffusion region, instead of requiring a separate mask for the tunnel region as in the FLOTOX process. Thus, the EEPROM fabrication process of the present invention is less complex, cheaper and less susceptible to defects.

A better understanding of the features and advantages of the present invention will be obtained by reference to the following detailed description of the invention and accompanying drawings which set forth an illustrative embodiment in which the principals of the invention are utilized.

DESCRIPTION OF THE DRAWINGS

FIG. 6A is a plan view drawing illustrating the field oxide and cell oxide locations of an EEPROM cell fabricated in accordance with the present invention.

FIG. 6B is a cross-sectional drawing illustrating the field oxide and cell oxide locations and relative thicknesses of an EEPROM cell fabricated in accordance with the present invention.

FIG. 7A is a plan view drawing illustrating the drain implantation area and the resulting drain diffusion region of an EEPROM cell fabricated in accordance with the present invention.

FIG. 7B is a cross-sectional drawing illustrating the photoresist mask used to form the drain implantation area and the drain diffusion region of an EEPROM cell fabricated in accordance with the present invention.

FIG. 8A is a plan view drawing illustrating the tunnel oxide layer grown on the drain implantation area of an EEPROM cell fabricated in accordance with the present invention.

FIG. 8B is a cross-sectional drawing illustrating the tunnel oxide layer grown on the drain implantation area of an EEPROM cell fabricated in accordance with the present invention.

DETAILED DESCRIPTION OF THE INVENTION

Figure 1:
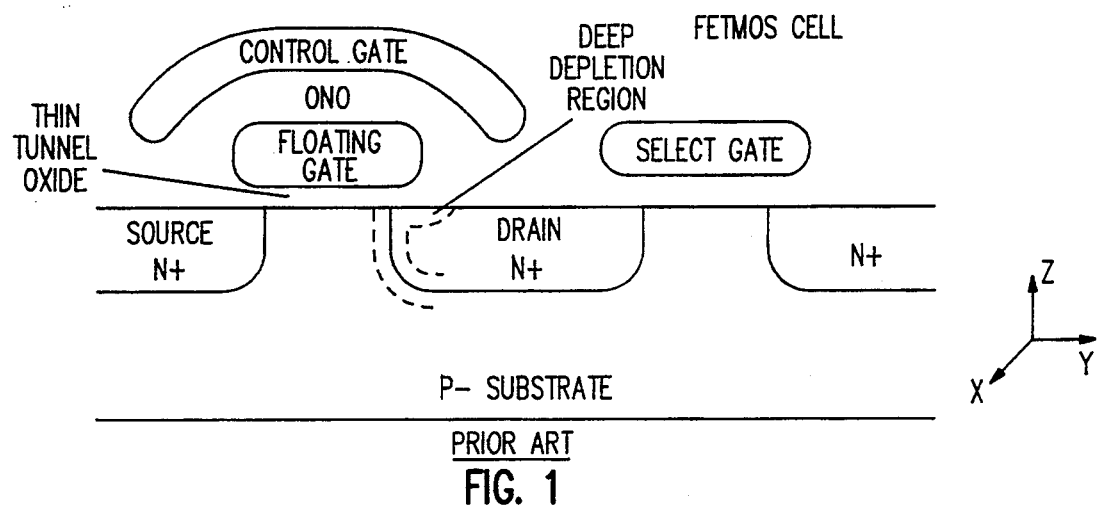
FIG. 1 is a cross-sectional drawing illustrating a conventional FETMOS EEPROM cell such that the cross-section is a plane bisecting the three diffusion regions of the FETMOS cell.

The present invention provides a method for fabricating a drain diffusion region that is utilizable in an electrically-erasableprogrammable read-only memory (IEEPROM) cell and that is self-aligned to the EEPROM cell's tunnel oxide.

Referring to FIGS. 6A and 6B, the fabrication process begins with a silicon substrate 10 of P-type conductivity. Typically, the P-type substrate 10 will have been developed as an isolation well for the N-type devices which ultimately make up the memory cell array. Under such circumstances, it is probable that other wells will exist on the same die, and perhaps some of them will be N-type wells. The description of the present invention will be confined to the processing which occurs after the formation of the P-well 10.

Conventional process techniques are utilized to define regions in the substrate 10 for formation of field oxide. That is, pad oxide is first grown on the surface of the substrate 10, followed by deposition of an overlying nitride layer. The pad oxide/nitride composite is masked with photoresist, which is then patterned to expose regions of underlying nitride which will ultimately define field oxide regions 11. The nitride is then etched, the photoresist is stripped, and a P-type field implant is performed through the exposed pad oxide regions. The field implant mask is then stripped and field oxide regions 11 are formed, as shown in FIGS. 6A and 6B.

As shown in FIG. 6B, during the formation of the field oxide regions 11, oxide "bird's beaks" 12 form at the periphery of the active silicon area due to lateral oxidation under the nitride layer. This effect is not desirable because the bird's beak 12 takes up lateral space. The region of the bird's beak 12 is also a high-stress region that will degrade the quality of any thin oxide grown over it. Therefore, this structure can give rise to an increase in the incidence of defective bits in a memory array.

In order to reduce the stress in the bird's beak regions 12, a sacrificial gate oxide layer (not shown) is grown and then stripped. A cell gate oxide 13 is then grown to a thickness of approximately 400 Angstroms. The active device region is defined beneath the gate oxide layer 13.

Referring to FIGS. 7A and 7B, a cell N+ photoresist mask 20 is then defined to provide openings in the areas through which N-type ions will be implanted into the substrate 10 to form the various diffusion regions of the EEPROM cell, including the N+ drain diffusion region. The opening for the drain diffusion region is a slit of minimum design dimension λ in the X direction, and, preferably, about 3 times the minimum dimension λ in the Y direction. The minimum design dimension in the X direction is selected to minimize the pitch of the cell in the X direction.

With the cell N+ photoresist mask 20 in place, a wet etch is performed to etch the cell gate oxide 13 back to bare silicon 10 in the drain implantation region so as to eliminate the oxide barrier to the implantation process. With the photoresist mask 20 still in place, a cell N+ implant is performed to define N+ drain region 22. A suitable dopant is Arsenic implanted at a concentration of $10^{14}$ per $cm^2$ at an energy of 80 KeV. Alternatively, Phosphorus is a suitable N-type dopant. Subsequently, the photoresist mask 20 is stripped.

Those skilled in the art will recognize that, alternatively, the sequence of the above-described gate oxide etch/implant steps can be reversed. That is, Arsenic can be implanted to form the N+ drain diffusion 22 with the gate oxide in place over the implantation region. Of course, a higher implant energy of about 160 KeV will be required to drive the Arsenic ions through the oxide to the desired depth in the substrate 10. The photoresist and oxide are then stripped as described above.

The ion implantation causes damage to the substrate in the drain region 22 so that, following implantation, this region is amorphous rather than crystalline. The amorphous drain region 22 is repaired utilizing an annealing step. A suitable annealing step is a dilute oxygen furnace cycle carded out at approximately 920 degrees Celsius. Because of the ambient oxygen, oxidation occurs during this annealing step, growing approximately 150 Angstroms of oxide on the surface of the drain region 22 and thickening the cell gate oxide 13 to approximately 500 Angstroms. Alternatively, the annealing step may be performed in a neutral ambient which may or may not be followed by a separate oxidation step.

If an annealing/oxidation process is utilized which results in growth of an oxide layer on the surface of the drain region 22, then a wet oxide strip is performed to remove the newly grown oxide. Then, a typical wet tunnel oxidation pre-clean cycle is performed. These two wet chemical steps will typically remove 240 Angstroms of oxide, leaving approximately 260 Angstroms of cell gate oxide 13.

Referring to FIGS. 8A and 8B, immediately after the tunnel oxide pre-clean, a tunnel oxide layer 30 is grown in the conventional manner. This oxidation cycle will grow a tunnel oxide layer 30 of approximately 83 Angstroms thickness on the surface of the drain region 22, and will increase the thickness of the cell gate oxide 13 to approximately 300 Angstroms. The rate of growth of the tunnel oxide 30 on the drain region 22 is greater than on the cell gate oxide 13 because of the high doping level of the drain region 22.

Figure 2:
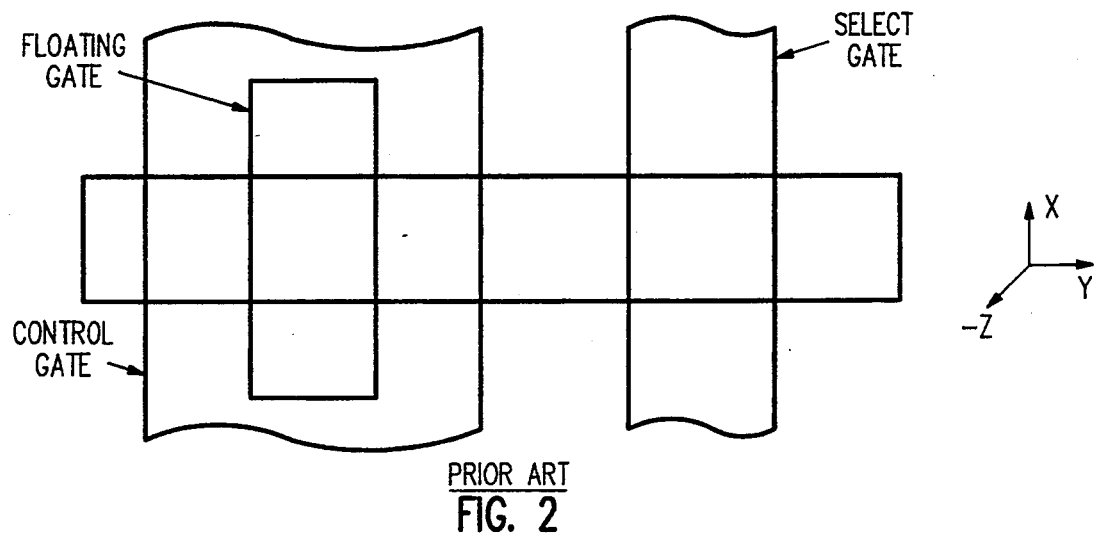
FIG. 2 is a plan view illustrating the layout of the FIG. 1 FETMOS cell.
Figure 3:
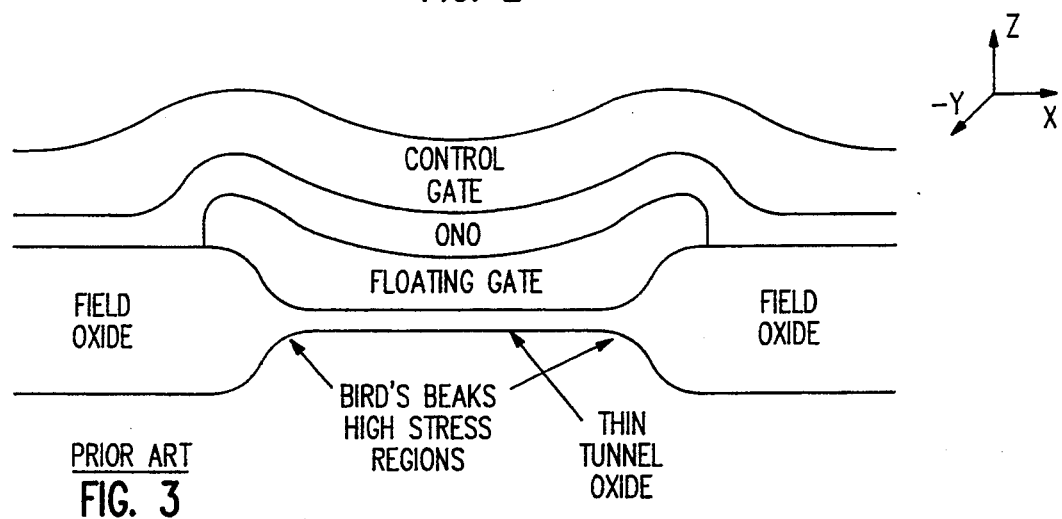
FIG. 3 is a cross-sectional drawing illustrating the FIG. 1 FETMOS cell such that the cross-section is a plane bisecting the control gate of the FETMOS cell.
Figure 4:
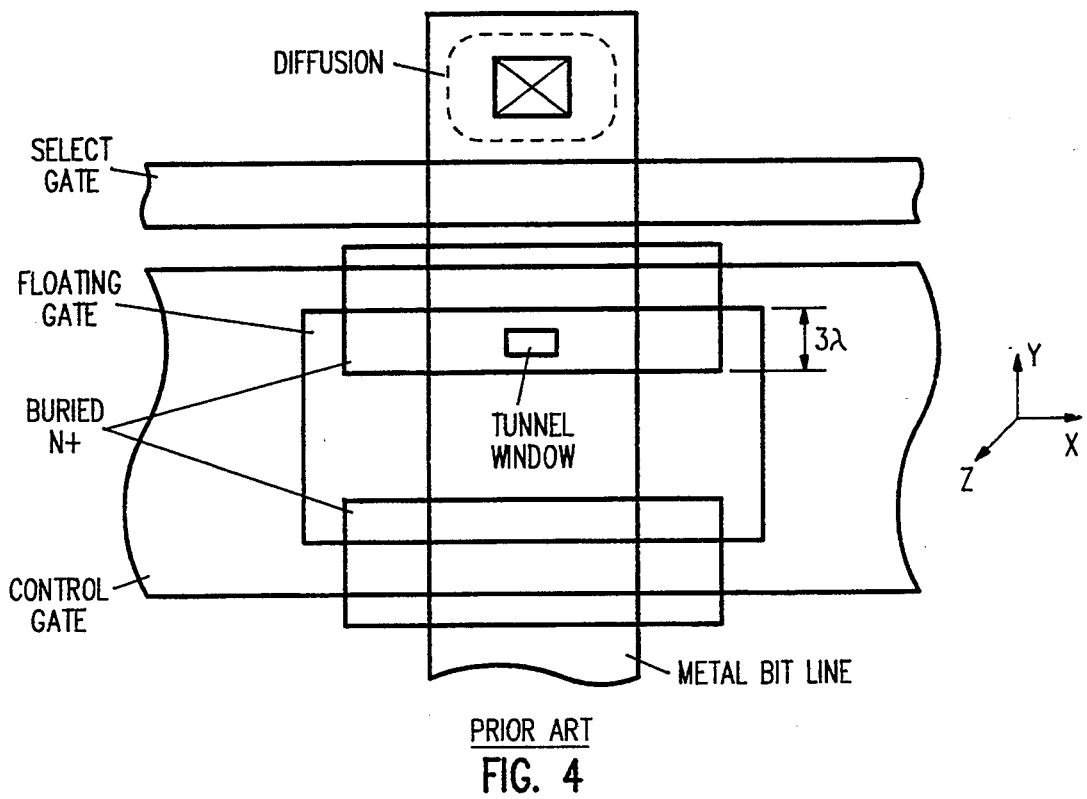
FIG. 4 is a plan view illustrating the layout of a conventional FLOTOX cell.
Figure 5:
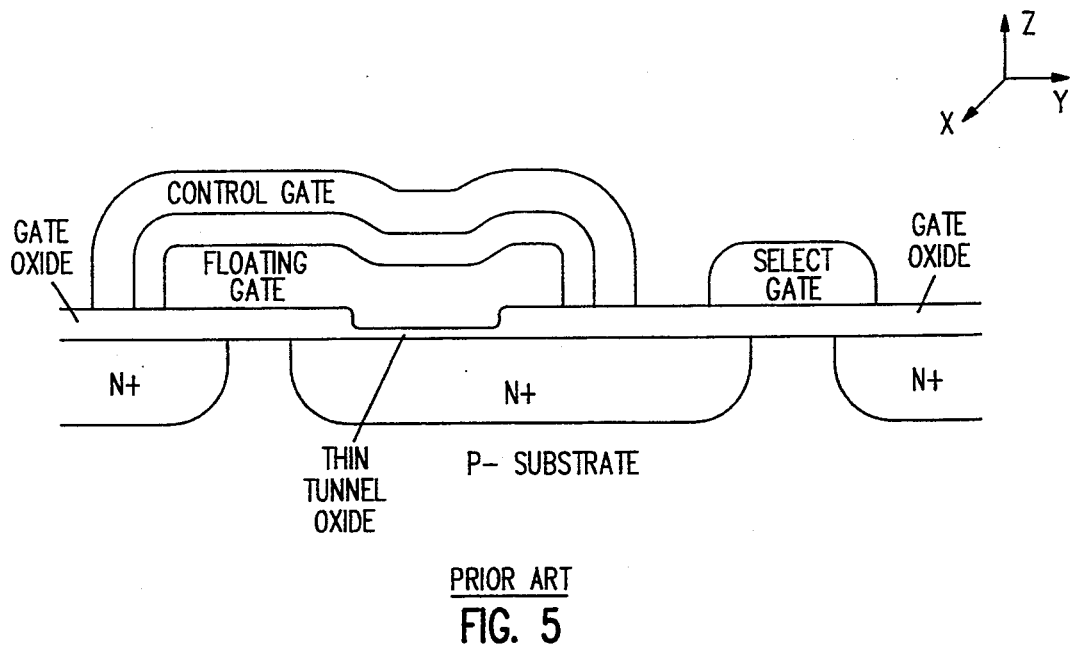
FIG. 5 is a cross-sectional drawing illustrating the FIG. 4 FLOTOX cell such that the cross-section is a plane bisecting the three diffusion regions of the FLOTOX cell.
Figure 9:
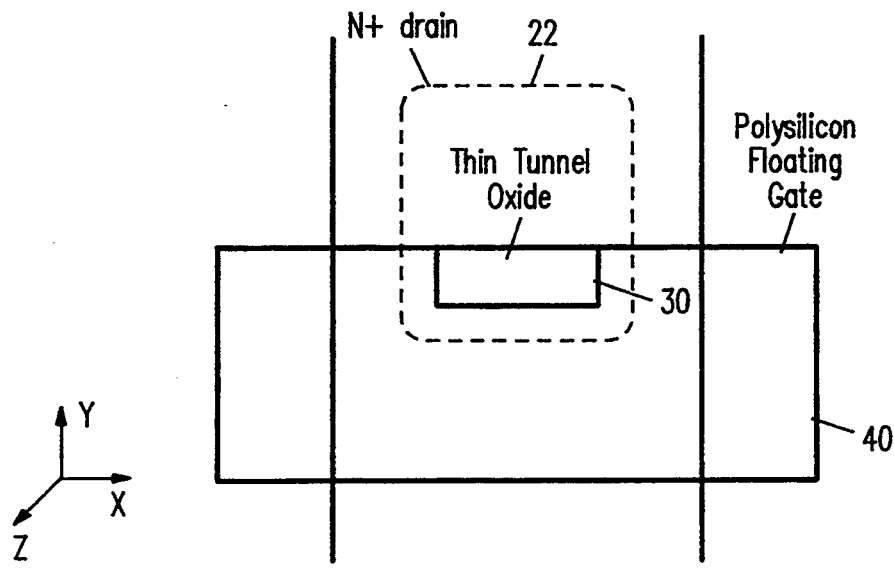
FIG. 9 is a plan view drawing illustrating the floating gate of an EEPROM cell fabricated in accordance with the present invention.
Figure 10:
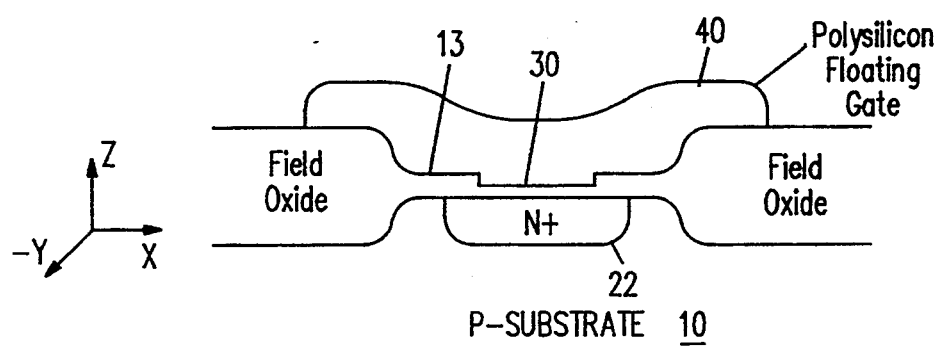
FIG. 10 is a cross-sectional drawing illustrating the floating gate of an EEPROM cell fabricated in accordance with the present invention.
Figure 11:
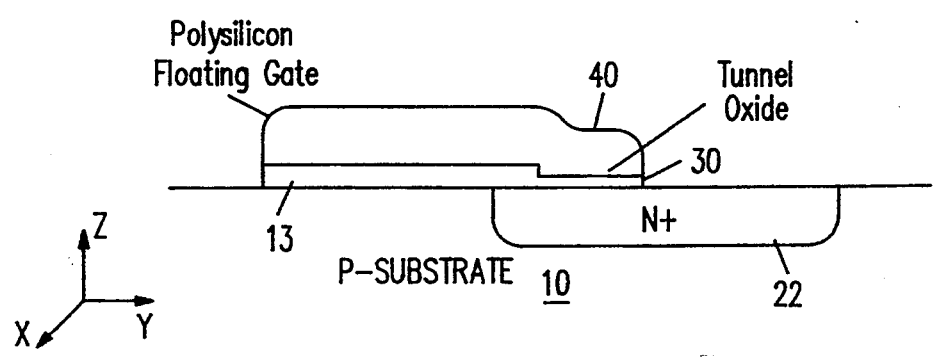
FIG. 11 is a cross-sectional drawing illustrating the floating gate of an EEPROM cell fabricated in accordance with the present invention such that the cross-section is a plane bisecting the drain diffusion region and the floating gate of the EEPROM cell.

Referring to FIG. 9, a first layer of polysilicon (poly1) is then deposited to a thickness of approximately 1500 Angstroms and doped with a dopant such as Phosphorus. This poly1 layer will ultimately be patterned to provide the floating gates 40 for the EEPROM cells of the array. A mask is defined and the poly1 layer is etched so that the drain region 22 underlaps the floating gate 40 by one minimum design dimension λ. A wet oxide etch may then be performed to remove all of the oxide on the silicon substrate 10 which is not protected by the polysilicon layer. FIG. 10 shows a cross-section of the polysilicon floating gate 40. FIG. 11 shows a cross-section of the polysilicon floating gate 40 from another angle, making it clear that the boundary between the N+ drain region 22 and the P-substrate 10 under the floating gate 40 occurs under thick gate oxide rather than under the thin tunnel oxide 30. This is one distinguishing attribute of the disclosed EEPROM cell structure over the conventional FETMOS cell structure shown in FIGS. 1-3.

Having constructed the drain and floating gate as described above, the process sequence then reverts to a conventional MOS process flow with the growth of gate oxide (which also serves as a seal oxide for the floating gate to ensure good charge retention).

Figures 18A, 18B:
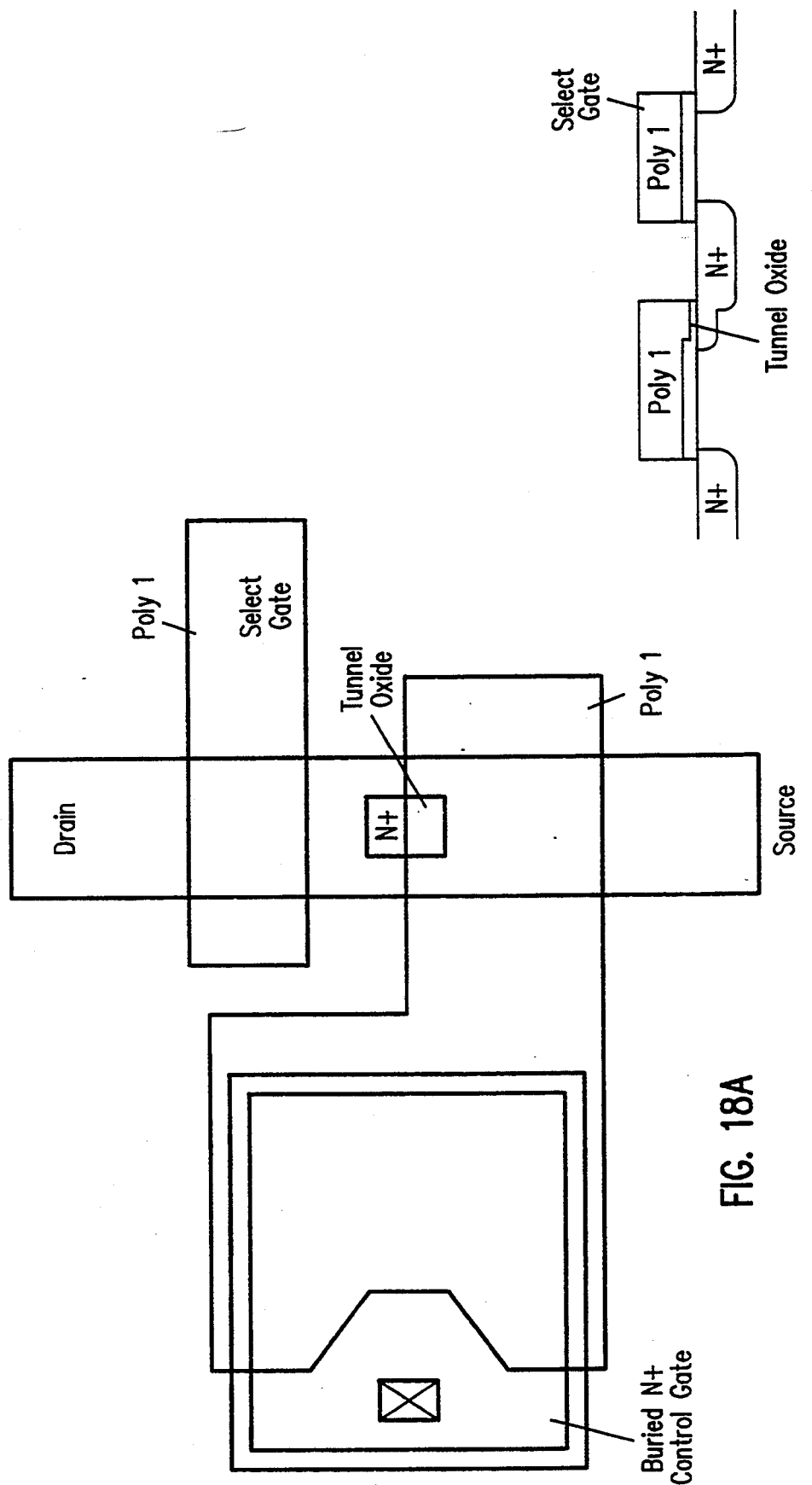
FIG. 18A is a plan view drawing illustrating an EEPROM cell structure resulting from a single poly process in accordance with the present invention.
FIG. 18B is a cross section drawing illustrating the FIG. 18A cell.

As shown in FIGS. 18A and 18B, in the above-described process flow, the single poly layer is used both as the floating gate of the EEPROM storage cell and as the gate of the cell's series select transistor.

The present invention also can be used to fabricate EEPROM cells in a double polysilicon process. A preferred embodiment in a double poly, single metal process is described below in conjunction with FIGS. 12-17.

The double poly process flow is identical to the single poly process flow through the deposition of the poly1 layer.

Figure 12:
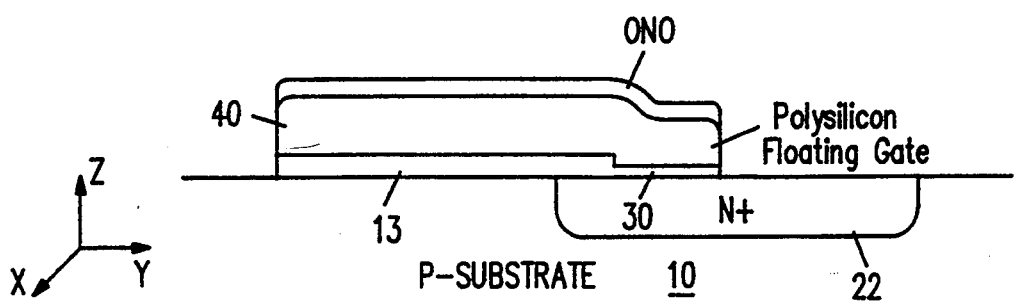
FIG. 12 is a cross section drawing illustrating ONO grown on the floating gate of an EEPROM cell fabricated in a double poly process in accordance with the present invention.

As shown in FIG. 12, following doping of the poly1 layer, a composite ONO layer is grown (e.g. 150 Angstroms of oxide, 300 Angstroms of nitride and a 60 Angstrom re-oxidation). The ONO/poly1 layer is then masked and etched in such a way that the edge of the poly1 floating gate 40 overlaps the edge of the cell N+ region 22 by one λ.

Figure 13:
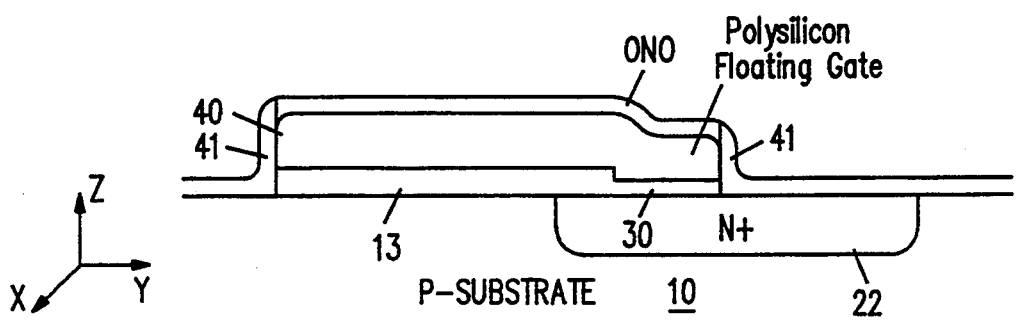
FIG. 13 is a cross section drawing illustrating formation of sidewall oxide on the ONO/poly1 structure shown in FIG. 12.

In order to seal the sidewall of the poly1 floating gate 40 and ensure good data retention, an oxidation is performed to grow approximately 700 Angstroms of sidewall oxide 41 on the poly sidewall, as shown in FIG. 13. This, of course, adds to the thickness of the oxide on the exposed active regions. At this point in the process, threshold Vt implants for the peripheral transistors may be performed as needed.

Figure 14:
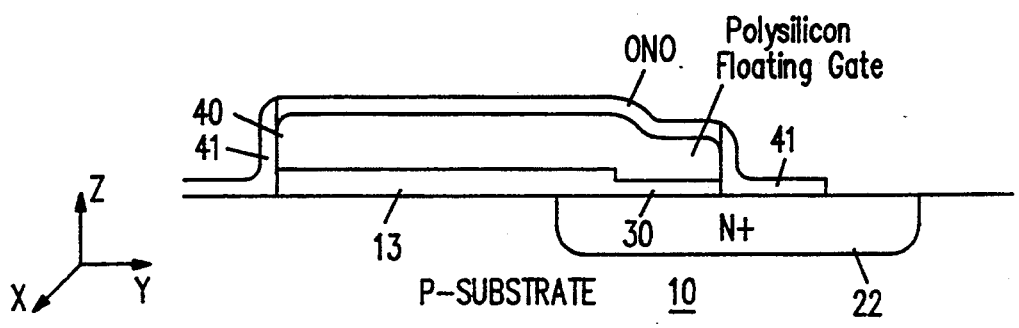
FIG. 14 is a cross section drawing illustrating etching of the gate oxide shown in the FIG. 13 structure.

A mask is then defined to protect the floating gate region and an oxide etch is performed to remove all oxide on active regions, as shown in FIG. 14. The floating gate protect mask prevents the floating gate poly sidewall oxide from being removed. Gate oxide is then grown and a second layer of polysilicon (poly2) is deposited and doped with POCl$_3$.

Figure 15:
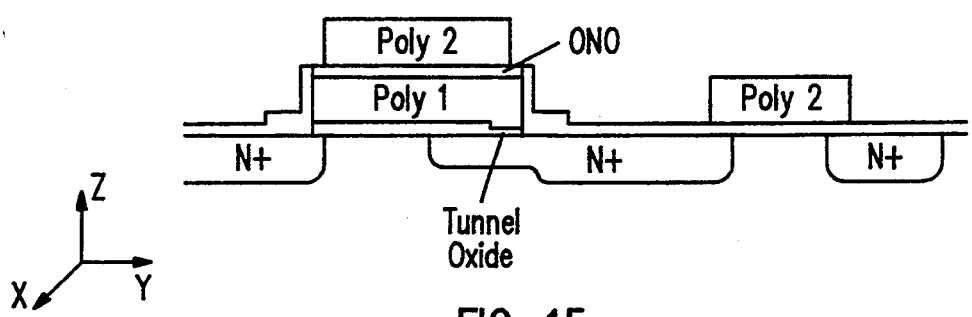
FIG. 15 is a cross section drawing illustrating an EEPROM cell structure resulting from a double poly process in accordance with the present invention.

The poly2 layer is then masked and etched to define the control gate of the storage cell and the gate of the series select transistor, as shown in FIG. 15, as well as the gates of the other active transistors required in the circuit.

The process then reverts to a conventional double poly process flow with the definition of source/drain regions.

Figure 16:
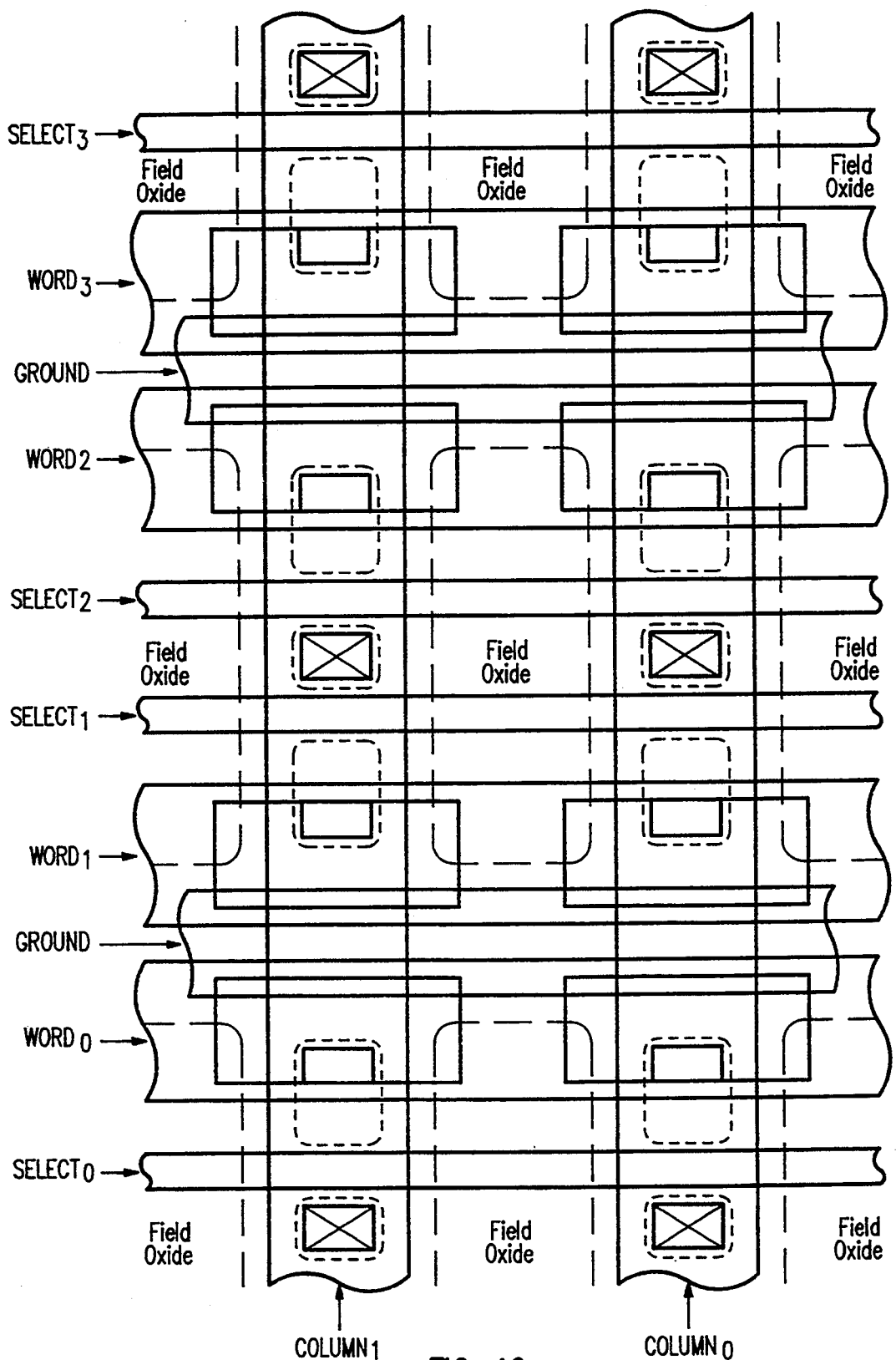
FIG. 16 is a plan view illustrating the layout of a portion of an EEPROM cell array resulting from a double poly process in accordance with the present invention.

FIG. 16 shows a plan view of a portion of an EEPROM array fabricated using a double poly process in accordance with the present invention.

Figure 17:
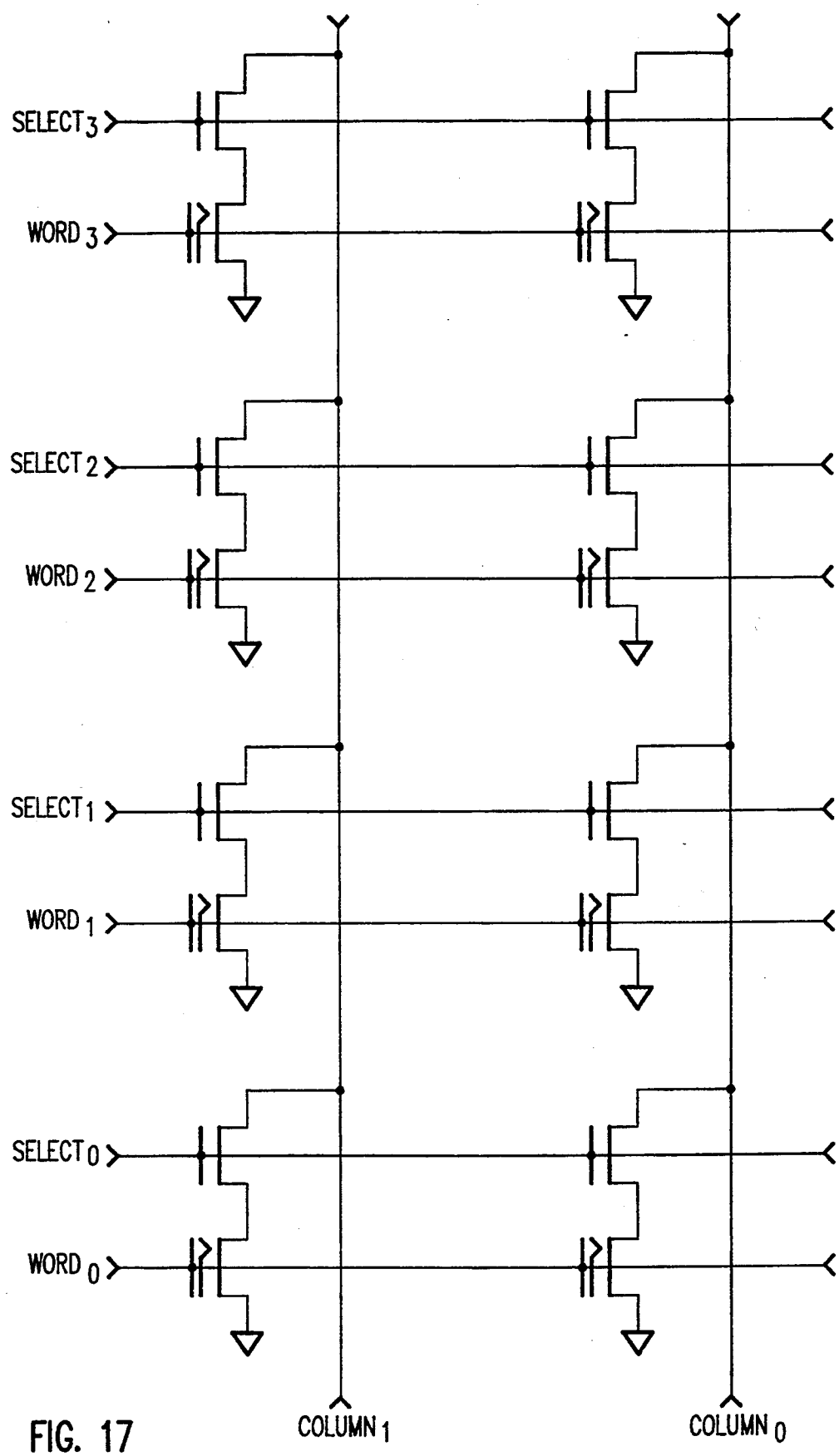
FIG. 17 is a schematic diagram illustrating circuits corresponding to the portion of the EEPROM cell array shown in FIG. 16.

FIG. 17 is a circuit diagram corresponding to the section of the double-poly EEPROM array shown in FIG. 16.

A memory array constructed in accordance with the present invention stores binary data using negative logic; therefore, an "erased" word contains all 1's, and a written word changes some of those 1's to 0's. To illustrate the operation of the array shown in FIGS. 16 and 17, the performance of read, write, and erase operations is described below.

Erasing of a memory word is performed by negatively charging the floating gate of every cell in the row corresponding to that word. This is accomplished by selecting a row by raising both the select line and the word line for that row to a high voltage Vpp (such as 20 Volts), while simultaneously grounding all the bit lines. This attracts electrons to the floating gates in the selected words. Any number of words may be erased in one erase cycle. The select lines and word lines for unselected words are held at ground.

Writing a word is accomplished by removing the negative charge held on selected bits within a previously erased word. This is done by selecting a row by raising the select line to Vpp, but holding the word line at ground. Selected bit lines are raised to Vpp while unselected bit lines are held at ground. Electrons are thus removed from the floating gates of the selected cells. Any number of previously erased words may be written with the same data during one write cycle. The select lines and word lines for unselected words are held at ground.

Reading a word is accomplished by asserting both the word line and the select line for that word at a normal high voltage (such as 5 Volts), and detecting the output on the bit lines using standard sense amplifier techniques.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A drain structure that includes a N+ drain diffusion region formed in a semiconductor substrate of P-type conductivity and an electrically conductive floating gate for use in an electrically-erasable programmable read-only memory (EEPROM) cell, the drain diffusion region being self-aligned to a tunnel dielectric region, the drain structure comprising:

(a) a layer of gate dielectric material formed on the substrate over a portion of the drain diffusion region and a substrate channel region between the drain diffusion region and a N+ source diffusion region formed in the substrate;

(b) a layer of tunnel dielectric material formed adjacent to the layer of gate dielectric and over a portion of the drain diffusion region such that the thickness of the tunnel dielectric material is less than the thickness of the gate dielectric material, the layer of tunnel dielectric material surrounded by the layer of gate dielectric material on three sides; and (c) a layer of conductive material formed over the layer of tunnel dielectric material and an adjacent portion of the gate dielectric material, the layer of conductive material forming the floating gate of the EEPROM cell, and wherein lateral edges of the drain diffusion region terminate in the substrate not only under the floating gate of the EEPROM cell, but also under the gate dielectric material.

2. A drain structure as in claim 1 wherein the gate dielectric material and the tunnel dielectric material comprise silicon dioxide.

3. A drain structure as in claim 2 wherein the conductive material comprises poly silicon.

4. A drain structure as in claim 3 wherein the drain diffusion region is doped with either Arsenic or Phosphorus.

5. An electrically-erasable programmable read-only memory (EEPROM) cell fabricated in a P-type substrate, the EEPROM cell comprising:

a N+ drain diffusion region formed in the substrate;

a common N+ source diffusion region formed in the substrate, the drain diffusion region and the source diffusion defining a first substrate channel region therebetween;

a select N+ drain diffusion region formed in the substrate, the drain diffusion region and the select N+ drain diffusion region defining a second substrate channel region therebetween;

a layer of gate oxide formed on the substrate, the layer of gate oxide including:
   a first gate oxide region overlying a first portion of the drain diffusion region and the first substrate channel region, and
   a second gate oxide region overlying the second substrate channel region;

a layer of tunnel oxide formed adjacent to the first gate oxide region and over a second portion of the drain diffusion region such that the thickness of the layer of tunnel oxide is less than the thickness of the layer of gate oxide, the layer of tunnel oxide and the second gate oxide region defining a third portion of the drain diffusion region therebetween;

a layer of first polysilicon including:
  a first polysilicon region overlying the first gate oxide region and the layer of tunnel oxide so that only the first portion of the drain diffusion region and the second portion of the drain diffusion region are covered by the first polysilicon region, the first polysilicon region forming the floating gate of the EEPROM cell, and
  a second polysilicon region overlying the second gate oxide region;

a layer of intermediate dielectric material overlying the floating gate;

a layer of second polysilicon overlying the layer of intermediate dielectric material;

a layer of insulating material overlying all layers previously described, having a contact window opening above a portion of the third portion of the drain diffusion region; and a layer of conductive material overlying a portion of said layer of insulating material, which occupies the contact window opening, and which forms a select line for the EEPROM cell.

6. An EEPROM cell as in claim 5 wherein the intermediate dielectric material comprises oxide/nitride/oxide composite.

7. An EEPROM cell as in claim 6 wherein the insulating material comprises silicon dioxide.

8. An EEPROM cell as in claim 7 wherein the third conductive material comprises aluminum.

* * * * *